(12) United States Patent  (10) Patent No.: US 8,829,998 B2
Yanay  (45) Date of Patent: Sep. 9, 2014

(54) DOHERTY POWER AMPLIFIER

(71) Applicant: Airspan Networks Inc., Boca Raton, FL (US)

(72) Inventor: Nadav Yanay, Ashdod (IL)

(73) Assignee: Airspan Networks Inc., Boca Raton, FL (US)

( * ) Notice: Subject to any disclaimer, the term of this patent is extended or adjusted under 35 U.S.C. 154(b) by 60 days.

(21) Appl. No.: 13/658,354

(22) Filed: Oct. 23, 2012

(65) Prior Publication Data

US 2014/0111282 A1  Apr. 24, 2014

(51) Int. Cl.
*H03F 3/68* (2006.01)
(52) U.S. Cl.
USPC .................................... 330/295; 330/124 R
(58) Field of Classification Search
USPC .............................. 330/295, 124 R, 84, 126
See application file for complete search history.

(56) References Cited

U.S. PATENT DOCUMENTS

| | | | |
|---|---|---|---|
| 5,757,229 A * | 5/1998 | Mitzlaff | 330/124 R |
| 7,345,535 B2 | 3/2008 | Kwon | |
| 7,427,895 B1 | 9/2008 | Okubo | |
| 7,518,449 B2 * | 4/2009 | Iwasaki | 330/124 R |
| 7,843,262 B2 * | 11/2010 | Takenaka | 330/136 |
| 8,164,384 B2 | 4/2012 | Dawson | |
| 2004/0174212 A1 * | 9/2004 | Kim et al. | 330/124 R |
| 2006/0152279 A1 * | 7/2006 | Kijima | 330/124 R |
| 2007/0075780 A1 * | 4/2007 | Krvavac et al. | 330/295 |
| 2009/0206927 A1 * | 8/2009 | Okubo et al. | 330/124 R |
| 2010/0301947 A1 | 12/2010 | Fujioka et al. | |
| 2011/0140786 A1 | 6/2011 | Blednov | |

* cited by examiner

*Primary Examiner* — Henry Choe
(74) *Attorney, Agent, or Firm* — Sughrue Mion, PLLC

(57) ABSTRACT

A Doherty power amplifier including a main amplifier, an auxiliary amplifier and a controller governing the operation of the auxiliary amplifier, the controller being operative to switch the operational state of the auxiliary amplifier between an operational state and a non-operational state as a function of input signal voltage supplied to the power amplifier such that the auxiliary amplifier is inoperative when the input voltage is below an input voltage threshold and is operative when the input voltage is above the input voltage threshold.

18 Claims, 1 Drawing Sheet

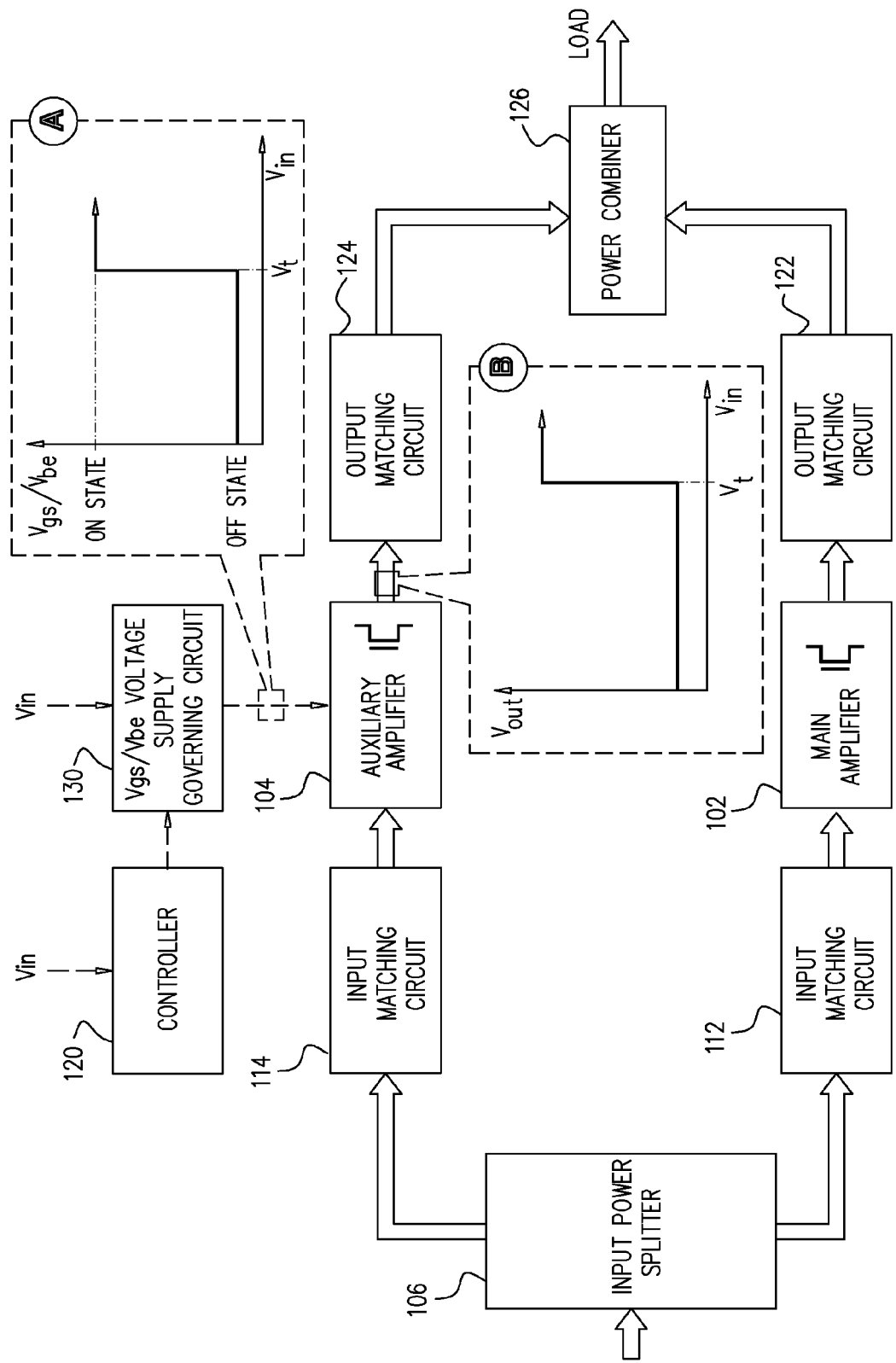

DOHERTY POWER AMPLIFIER

FIELD OF THE INVENTION

The present invention relates to Doherty power amplifiers generally.

BACKGROUND OF THE INVENTION

The following U.S. patent publications are believed to represent the current state of the art:

U.S. Pat. Nos. 7,427,895; 7,518,449 and 7,345,535;

U.S. Published Patent Application Nos.: 2010/0301947 and 2011/01408786.

SUMMARY OF THE INVENTION

The present invention seeks to provide an improved Doherty power amplifier. There is thus provided in accordance with a preferred embodiment of the present invention a Doherty power amplifier including a main amplifier, an auxiliary amplifier and a controller governing the operation of the auxiliary amplifier, the controller being operative to switch the operational state of the auxiliary amplifier between an operational state and a non-operational state as a function of input signal voltage supplied to the power amplifier such that the auxiliary amplifier is inoperative when the input voltage is below an input voltage threshold and is operative when the input voltage is above the input voltage threshold.

Preferably, the input voltage threshold is at least 120% (1.6 dB) of the input voltage which produces the rated RMS output power level of the Doherty power amplifier. Alternatively, the input voltage threshold is at least 250% (8 dB) of the input voltage which produces the rated RMS output power level of the Doherty power amplifier. Alternatively, the input voltage threshold is at least 300% (9.5 dB) of the input voltage which produces the rated RMS output power level of the Doherty power amplifier.

Preferably, the operational characteristics of the auxiliary amplifier are fixed and include a conduction angle of at least $\pi$. Preferably, the input voltage threshold is variable.

Preferably, amplified signal outputs of the main amplifier and the auxiliary amplifier are supplied via corresponding output matching circuits and via an output power combiner to a load. Preferably, the power combiner is a conventional Doherty power combiner. Alternatively, the power combiner is a non-conventional Doherty power combiner. Preferably, the power combiner includes an impedance inverter connected to the main amplifier and two transmission lines which connect the power combiner to the main amplifier and the auxiliary amplifier.

Preferably, the main amplifier and the auxiliary amplifier both receive a common split signal via an input power splitter. Preferably, the input power splitter is a Doherty input power splitter. Preferably, the input power splitter also preferably provides for a 90 degree compensation to the power combiner, thereby being operative to match the phases of the main amplifier and the auxiliary amplifier at peak power while both the main amplifier and the auxiliary amplifier are in the operational state.

Preferably, the main amplifier and the auxiliary amplifier are transistor amplifiers. Preferably, the controller is a digital controller. Alternatively, the controller is an analog controller.

BRIEF DESCRIPTION OF THE DRAWINGS

The present invention will be understood and appreciated more fully from the following detailed description, taken in conjunction with the drawing in which:

FIG. 1 is a simplified illustration of a Doherty power amplifier constructed and operative in accordance with a preferred embodiment of the present invention.

DETAILED DESCRIPTION OF A PREFERRED EMBODIMENT

Reference is now made to FIG. 1, which is a simplified illustration of a Doherty power amplifier 100 constructed and operative in accordance with a preferred embodiment of the present invention. As seen in FIG. 1, the Doherty power amplifier comprises a main power amplifier 102 and an auxiliary power amplifier 104, both of which receive a common signal via an input power splitter 106 and respective input matching circuits 112 and 114. A controller 120 governs the operation of the auxiliary power amplifier 104.

In accordance with a preferred embodiment of the present invention, controller 120 is operative to switch the operational state of the auxiliary amplifier 104, between an operational state and a non-operational state, as a function of the input signal voltage supplied to the power amplifier, as at input power splitter 106, such that the auxiliary amplifier 104 is inoperative when the input voltage is below an input voltage threshold and is operative when said input voltage is above the input voltage threshold.

Preferably, the amplified signal outputs of main amplifier 102 and auxiliary amplifier 104 are supplied via respective output matching circuits 122 and 124 and via an output power combiner 126 to a load.

Power combiner 126 is preferably a conventional Doherty power combiner which preferably comprises an impedance inverter connected to main amplifier 102 and two transmission lines which connect power combiner 126 to each of amplifiers 102 and 104.

Input power splitter 106 is preferably a Doherty input power splitter which also preferably provides for a 90 degree compensation to power combiner 126, thereby being operative to match the phases of main amplifier 102 and auxiliary amplifier 104 at peak power while both main amplifier 102 and auxiliary amplifier 104 are in an operative state.

In accordance with a preferred embodiment of the present invention, both the main amplifier 102 and the auxiliary amplifier 104 operate as class A/AB amplifiers.

Class A amplifiers are characterized that they have a conduction angle $\theta$ of $2\pi$.

Class AB amplifiers are characterized in that the conduction angle $\theta$ is defined by: $\pi \leq \theta \leq 2\pi$.

Class B amplifiers are characterized that they have a conduction angle $\theta$ of $\pi$.

Preferably, both the main amplifier 102 and the auxiliary amplifier 104 are transistor amplifiers, such as amplifiers employing FET or BJT components. When FET components are employed, the operational state of the amplifier is governed by a Vgs voltage input thereto and when BJT components are employed, the operational state of the amplifier is governed by a Vbe voltage input thereto.

Further in accordance with a preferred embodiment of the present invention, the input matching circuits 112 and 114 are tuned for class A/AB operation. It is appreciated that main amplifier 102 is preferably tuned by matching circuit 112 for high efficiency output, and that auxiliary amplifier 104 is preferably tuned by matching circuit 114 to output the maximum power available for P1dB or P3dB points.

Additionally in accordance with a preferred embodiment of the present invention, the output matching circuits 122 and 124 are tuned for class A/AB operation.

Controller 120 may be a digital or analog controller, which receives an input indication of the input signal waveform to the power amplifier, such as the input signal waveform applied to the input of the input power splitter 106. Controller 120 preferably calculates the signal envelope, compares the signal envelope to a preferably pre-defined threshold, and outputs to a Vgs/Vbe voltage supply governing circuit 130, which receives a voltage input from a power supply (not shown) and outputs a Vgs or Vbe voltage to auxiliary amplifier 104 in accordance with control inputs received from controller 120.

It is a particular feature of the present invention that controller 120 governs the operation of the auxiliary amplifier 104, such that the auxiliary amplifier 104 is not operative until the input voltage to the Doherty power amplifier exceeds an input voltage threshold or until the input signal envelope exceeds a preferably pre-defined input envelope threshold, which is a function of the input voltage or input signal which produces the rated RMS output power level of the Doherty power amplifier.

In accordance with one embodiment of the present invention, the input voltage threshold is at least 120% (1.6 dB) of the input voltage which produces the rated RMS output power level of the Doherty power amplifier.

In accordance with another embodiment of the present invention, the input voltage threshold is at least 250% (8 dB) of the input voltage which produces the rated RMS output power level of the Doherty power amplifier.

In accordance with a further embodiment of the present invention, the input voltage threshold is at least 300% (9.5 dB) of the input voltage which produces the rated RMS output power level of the Doherty power amplifier.

It is a particular feature of the present invention that voltage supply governing circuit 130 produces a voltage pattern as shown in enlargement A of FIG. 1, characterized by an immediate sharp rise in the Vgs or Vbe. Preferably, voltage supply governing circuit 130 is a two-state switch. Alternatively, voltage supply governing circuit 130 may be any other suitable device which provides an input voltage pattern which is similar to that shown in enlargement A.

The input voltage pattern shown in enlargement A produces a voltage output pattern from the auxiliary amplifier 104 which is shown in enlargement B.

It is appreciated that the present invention is applicable to Doherty power amplifiers of various types, such as Doherty power amplifiers operative in any suitable frequency band and any suitable power level. The main amplifiers 102 and auxiliary amplifier 104 may be embodied using any suitable transistor technology.

It will be appreciated by persons skilled in the art that the present invention is not limited by what has been particularly shown and described hereinabove. Rather the scope of the present invention includes both combinations and subcombinations of the various features described hereinabove as well as modifications and variations thereof which would occur to persons skilled in the art upon reading the foregoing and which are not in the prior art.

The invention claimed is:

1. A Doherty power amplifier comprising:
    a main amplifier;
    an auxiliary amplifier; and
    a controller governing the operation of said auxiliary amplifier, said controller being operative to switch the operational state of said auxiliary amplifier between an operational state and a non-operational state as a function of input signal voltage supplied to said power amplifier such that said auxiliary amplifier is inoperative when said input voltage is below an input voltage threshold and is operative when said input voltage is above said input voltage threshold, said auxiliary amplifier having a voltage output pattern characterized by an immediate sharp rise in the output voltage of the auxiliary amplifier once the input voltage rises above said input voltage threshold.

2. A Doherty power amplifier according to claim 1 and wherein said input voltage threshold is at least 120% (1.6 dB) of the input voltage which produces the rated RMS output power level of the Doherty power amplifier.

3. A Doherty power amplifier according to claim 1 and wherein said input voltage threshold is at least 250% (8 dB) of the input voltage which produces the rated RMS output power level of the Doherty power amplifier.

4. A Doherty power amplifier according to claim 1 and wherein said input voltage threshold is at least 300% (9.5 dB) of the input voltage which produces the rated RMS output power level of the Doherty power amplifier.

5. A Doherty power amplifier according to claim 1 and wherein the operational characteristics of said auxiliary amplifier are fixed and include a conduction angle of at least $\pi$.

6. A Doherty power amplifier according to claim 1 and wherein said input voltage threshold is variable.

7. A Doherty power amplifier according to claim 1 and wherein amplified signal outputs of said main amplifier and said auxiliary amplifier are supplied via corresponding output matching circuits and via an output power combiner to a load.

8. A Doherty power amplifier according to claim 7 and wherein said power combiner is a conventional Doherty power combiner.

9. A Doherty power amplifier according to claim 7 and wherein said power combiner is a non-conventional Doherty power combiner.

10. A Doherty power amplifier according to claim 7 and wherein said power combiner comprises an impedance inverter connected to said main amplifier and two transmission lines which connect said power combiner to said main amplifier and said auxiliary amplifier.

11. A Doherty power amplifier according to claim 7 and wherein said main amplifier and said auxiliary amplifier both receive a common split signal via an input power splitter.

12. A Doherty power amplifier according to claim 11 and wherein said input power splitter is a Doherty input power splitter.

13. A Doherty power amplifier according to claim 11 and wherein said input power splitter also provides for a 90 degree compensation to said power combiner, thereby being operative to match the phases of said main amplifier and said auxiliary amplifier at peak power while both said main amplifier and said auxiliary amplifier are in said operational state.

14. A Doherty power amplifier according to claim 1 and wherein said main amplifier and said auxiliary amplifier are transistor amplifiers.

15. A Doherty power amplifier according to claim 1 and wherein said controller is a digital controller.

16. A Doherty power amplifier according to claim 1 and wherein said controller is an analog controller.

17. A Doherty power amplifier according to claim 1 and wherein said immediate sharp rise comprises an immediate sharp rise in a Vgs voltage.

18. A Doherty power amplifier according to claim 1 and wherein said immediate sharp rise comprises an immediate sharp rise in a Vbe voltage.

* * * * *